United States Patent [19]

Kleiner

[11] Patent Number: 4,977,374

[45] Date of Patent: Dec. 11, 1990

[54] RADIATION HARDENED MAGNETIC VOLTAGE AND/OR CURRENT REFERENCE PRODUCED BY A SATURABLE, TWO CORE TRANSFORMER WITH FIRST HARMONIC NULLING

[76] Inventor: Charles T. Kleiner, P.O. Box 17879, Anaheim, Calif. 92817

[21] Appl. No.: 396,232

[22] Filed: Aug. 21, 1989

[51] Int. Cl.$^5$ ........................ G01R 33/04; G05F 1/335

[52] U.S. Cl. .................................... 324/254; 323/253; 324/225

[58] Field of Search ................................ 324/253–255, 324/225; 33/361; 323/214, 249, 251–253, 302, 310

[56] References Cited

U.S. PATENT DOCUMENTS

| | | | |
|---|---|---|---|
| 2,388,070 | 10/1945 | Middel | 324/254 X |
| 3,159,785 | 12/1964 | Beynon | 324/254 |
| 3,218,547 | 11/1965 | Ling | 324/254 |
| 3,286,169 | 11/1966 | Slonczewski | 324/254 |
| 3,919,630 | 11/1975 | Oshima et al. | 324/254 X |
| 4,059,796 | 11/1977 | Rhodes | 324/253 |
| 4,100,492 | 7/1978 | Forster | 324/254 |
| 4,677,381 | 6/1987 | Geerlings | 324/254 X |

FOREIGN PATENT DOCUMENTS

| | | | |
|---|---|---|---|
| 1202533 | 8/1970 | United Kingdom | 324/254 |

OTHER PUBLICATIONS

Geyger, William A., "The Ring-Core Magnetometer-A New Type . . . Magnetometer", AIEE transactions, V. 81, pt. 1 (Communications & Electronics) #59, Mar. 1962, pp. 65–73.

*Primary Examiner*—Gerard R. Strecker
*Attorney, Agent, or Firm*—Morland C. Fischer

[57] ABSTRACT

A highly accurate, predictable and stable magnetic voltage and/or current reference that is substantially impervious to potentially hazardous radiation including neutrons, single or multiple particles, ionizing doses, particle beams and the like. The magnetic reference includes a stable permanent magnet which functions as a primary magnetic reference and generates a magnetic field. A magnetic field detector, comprising a second harmonic null detector (or fluxgate), senses the magnetic field generated by the magnet. A fed back current applied to control windings of the magnetic field detector cancels the magnetic field generated by the magnet and, in so doing, produces an AC error signal. This AC error signal is processed by an electronic control amplifier which provides the current that is fed back to the magnetic field detector. The output of the electronic control amplifier is a precise voltage and/or current which is applicable to precision electronics that may be exposed to radiation within a hostile environment.

7 Claims, 4 Drawing Sheets

RADIATION HARDENED MAGNETIC VOLTAGE AND/OR CURRENT REFERENCE PRODUCED BY A SATURABLE, TWO CORE TRANSFORMER WITH FIRST HARMONIC NULLING

This invention was made with Government support under Air Force contract Nos. F04704-88-C--63 and F04704-90-C-0008. The Government has certain rights to this invention.

BACKGROUND OF THE INVENTION

1. FIELD OF THE INVENTION

This invention relates to a magnetic voltage and/or current reference that provides a stable, precise and virtually radiation impervious voltage and/or current which may be applied to missile guidance systems, accelerometers, digital-to-analog and analog-to-digital converters, gyrotorque converters, and other precision electronics that may operate within a hostile, radiation filled environment, such as that produced by space radiation or nuclear fusion/fission apparatus.

2. BACKGROUND ART

Systems are known by which to generate an accurate DC or AC reference voltage and/or current. However, contemporary systems typically employ semiconductor, as opposed to magnetic, methods. Although magnetic references pre-date semiconductor technology, such magnetic references were widely abandoned in early 1960's due to the improvement in semiconductor processing and the development of the integrated circuit.

Precision semiconductor references rely on the zener and/or avalanche characteristics of a PN junction to obtain the largest portion of a reference voltage. In order to obtain an overall low temperature coefficient, an additional PN junction is placed in series with the zener junction to provide a low sensitivity to temperature within a very small volume. The aforementioned precision junction references are often integrated in a monolothic linear integrated circuit chip using DC current sources and amplifiers/buffers to provide a low impedance voltage or current to other semiconductor electronics.

However, because of the inherent limitations in the properties of semiconductor materials (e.g. the reduction of semiconductor lifetime due to radiation damage), it is difficult to maintain high precision when employing this type of semiconductor reference within a hostile environment. Moreover, errors caused by the zener voltage shift can be propagated to instrument parameters whereby to cause degradation of overall system accuracy. Hence, it would be desirable to find an alternative to the semiconductor precision reference by using non-semiconductor (e.g. magnetic) materials.

Reference may be made to the following United States Patents for examples of magnetic based circuits which are adapted to measure an external magnetic field:

2,388,070 Oct. 30, 1945
3,159,785 Dec. 1, 1964
4,059,796 Nov. 22, 1977

SUMMARY OF THE INVENTION

In general terms, a radiation hardened magnetic reference is disclosed by which to generate a highly accurate, predictable, stable and radiation hard voltage and/or current for application to precision electronics that may be exposed to radiation (e.g. neutrons, single or multiple particles, ionizing doses, particle beams), such as that produced by space radiation or nuclear fusion/fission apparatus. The magnetic reference employs a highly stable permanent magnet as a basic reference and source of magnetic flux. A second harmonic null detector (or fluxgate) is driven by a source of AC reference voltage and used as a magnetic field detector so as to sense and cancel the flux generated by the magnet. The output of the null detector is an AC error signal which is the second harmonic of the AC reference voltage and is proportional to the difference between the magnetic flux field and a field produced by the application of a fed back current to a control winding of the null detector. The error signal is processed by an electronic control amplifier which provides the fed back DC current to the null detector via a closed control loop so that the flux can be cancelled. The output of the electronic control amplifier is a radiation impervious voltage and/or current which is compatible with existing control electronic interfaces.

The null (i.e. magnetic field) detector which is connected in a closed control loop with the electronic control amplifier to form the radiation hardened magnetic reference of this invention includes a two core saturable transformer. A pair of series connected primary windings are wound around respective magnetic cores of the transformer such that the voltages across the primary windings add to one another. A pair of secondary windings are also wound around the cores such that the voltages across the secondary windings subtract from one another and thereby cancel the voltage across the primary windings. A pair of series connected control windings are wound around and between the transformer cores to receive the fed back current from the electronic control amplifier and thereby establish a field in opposition to the flux field generated by the magnet. The secondary windings of the transformer are connected in series with a band pass filter and a parallel tuned tank. The AC error signal and output of the null detector is produced across the secondary winding of an impedance matching transformer. The primary winding of such transformer is connected in parallel with a capacitor to form the aforementioned tank.

The electronic control amplifier receives the AC error signal from the null detector which selects the second harmonic thereof and rejects all other frequencies. The second harmonic signal is demodulated to DC. The demodulated DC signal is then filtered and buffered to produce the stable, radiation impervious voltage and/or current as well as the fedback current for the null detector.

DESCRIPTION OF THE PREFERRED EMBODIMENT

Figure 1:
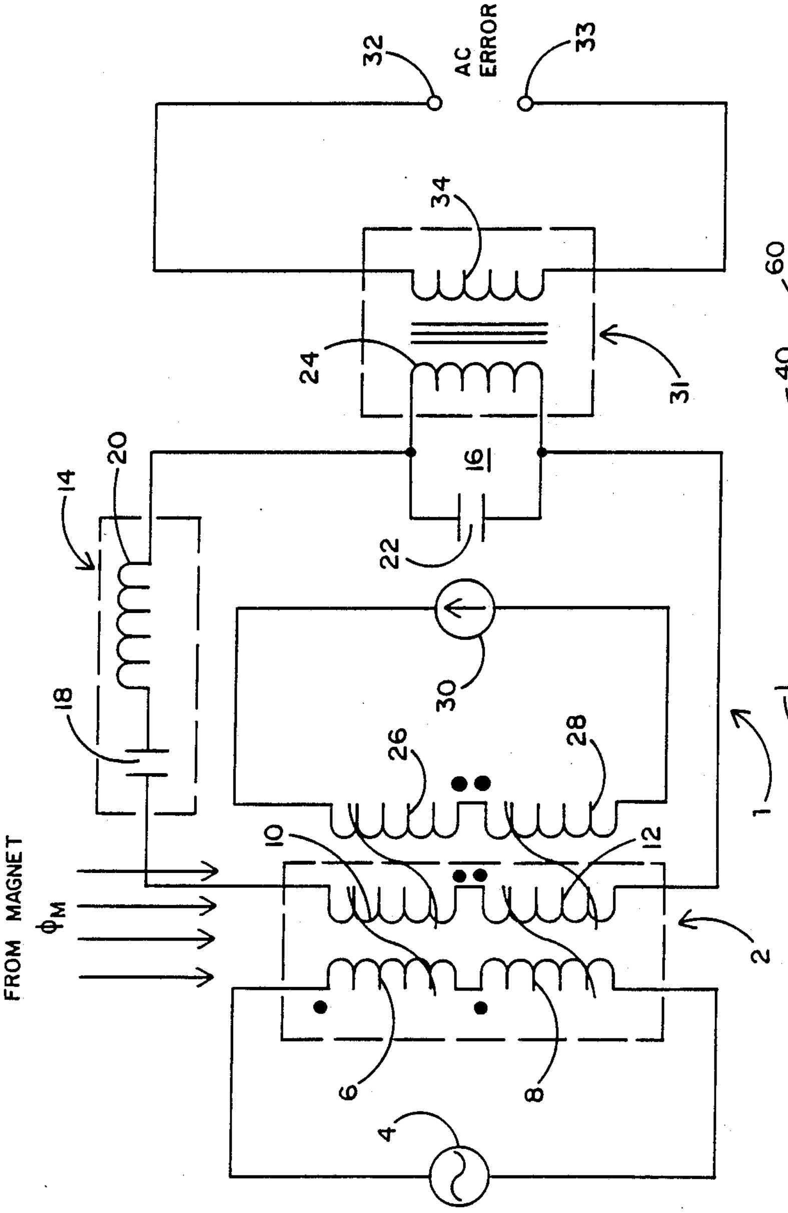
FIG. 1 is a schematic circuit of a second harmonic magnetic field detector which forms the radiation hardened magnetic reference of the present invention.

The radiation hardened magnetic reference which forms the present invention is best described while referring to the drawings, where FIG. 1 shows a schematic circuit for a magnetic field detector 1. More particularly, magnetic field detector 1 includes a 2-core variable saturable transformer 2 that is driven by a source 4 of AC reference voltage. The cores of saturable transformer 2 are located within lines of magnetic flux (designated $\phi$) generated by a stable permanent magnet (not shown) which is employed as a basic reference. The magnet described herein is made very hard with respect to radiation damage, such that the domain walls thereof are strongly aligned (i.e. with strong crystal bonding) and difficult to dislodge. By way of example only, a radiation and temperature resistant magnet which may be used herein as the basic reference is formed from magnetic materials such as Sumarium - Cobalt with rare earth compounds.

The primary of transformer 2 includes the series connection of a first pair of windings 6 and 8. Primary windings 6 and 8 are connected in electrical series with AC source 4. The secondary of transformer 2 includes the series connection of a second pair of windings 10 and 12 in phase opposition to primary windings 6 and 8. Secondary windings 10 and 12 are connected in electrical series with a band pass filter 14 and a parallel tuned tank 16. That is, band pass filter 14 comprises a capacitor 18 and an inductor 20 connected in electrical series. Tank 16 comprises a capacitor 22 and a winding 24 connected in electrical parallel.

A pair of series connected DC control windings 26 and 28 are wound between the cores of saturable transformer 2 (best illustrated in FIG. 2) and magnetically coupled to the primary windings 6, 8 and secondary windings 10, 12 of said transformer. A source 30 of DC current is connected in a current path with control windings 26 and 28 to supply a DC control current thereto. As will soon be explained, current source 30 supplies a DC control current that is fed back to detector 1 from an electronic control amplifier (designated 40 in FIG. 3).

The parallel tuned tank 16 forms an impedance matching transformer 31 by which to generate an AC error signal across the output terminals 32 and 33 of magnetic field detector 1. More particularly, the winding 24 of tank 16 is the primary of transformer 31. Another winding 34 forms the secondary of transformer 31. The voltage across secondary winding 34 reflects the AC error signal provided by magnetic field detector 1.

The operation of the magnetic field detector 1 of the radiation hardened magnetic reference of the present invention is now described. An AC reference voltage is applied from AC source 4 to the primary windings 6 and 8 of saturable transformer 2. In the absence of both a magnetic field and a DC control current from current source 30, and provided that the windings and cores of transformer 2 are perfectly matched, the net voltage appearing across the secondary windings 10 and 12 of transformer 2 is zero, regardless of the magnitude of the AC reference voltage. When either a magnetic field is present or a DC control current is applied to control windings 26 and 28 from current source 30, the voltage across secondary windings 10 and 12 increases proportionately with the magnetic field and/or the control current. The corresponding frequency of said voltage will be twice the frequency of the reference voltage applied from AC source 4. Thus, the magnetic field detector 1 herein described forms what is sometimes known in the art as a second harmonic modulator or detector. The higher the permeability of the core material of transformer 2, the higher will be the sensitivity of the detector 1.

The voltage across secondary windings 10 and 12 is processed through band pass filter 14 and tuned tank 16. Accordingly, an AC error signal is produced at the output terminals 32 and 33 of detector 1 which is characterized by either an in-phase or an out-of-phase second harmonic frequency depending upon the direction of the magnetic flux and the polarity of the DC control current from source 30.

The magnitude of the control current at source 30 increases when the magnitude of the magnetic flux is increased. The control current that is supplied to control windings 26 and 28 source 30 is a current that is fed back to detector 1 from an electronic control amplifier, the details of which will be described in greater detail hereinafter when referring to FIGS. 3 and 5. The gain or sensitivity of magnetic field detector 1 is inversely proportional to the volume of the magnetic core material and the operating frequency thereof. Since the magnetic field detector 1 is normally at null (i.e. characterized by the absence of a magnetic field and no current from source 30), any perturbations in the AC reference voltage from source 4 will effect only the gain. Likewise, offset is dependent upon matching of the magnetic cores of transformer 2, and such matching can be accurately accomplished. Accordingly, the components by which to implement the magnetic field detector 1 will be substantially unaffected by such hostile environments as neutrons, single or multiple particles, ionizing doses, particle beams, and the like.

Figure 2:
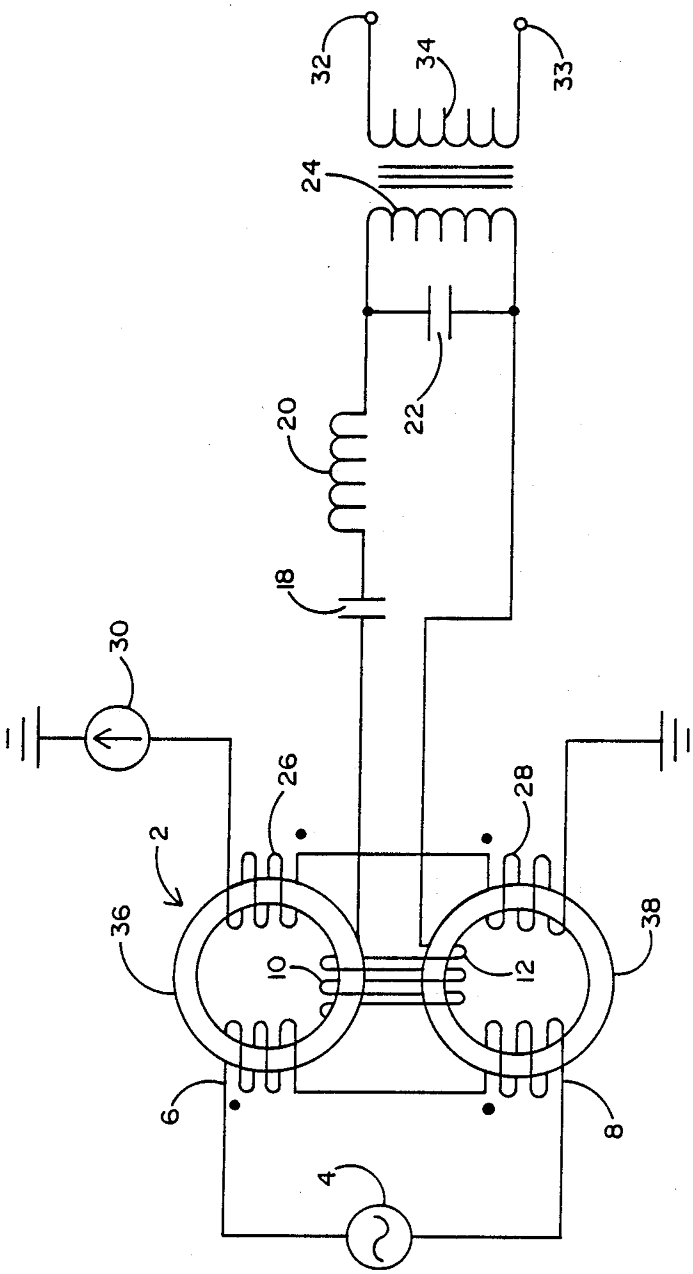
FIG. 2 illustrates a core diagram of the magnetic field detector of FIG. 1.

FIG. 2 of the drawings illustrates a preferred core configuration for implementing the magnetic field detector 1 of FIG. 1 which forms the radiation hardened magnetic reference of the present invention. More particularly, two saturable cores 36 and 38 of transformer 2 are shown with their respective primary and secondary windings 6, 8 and 10, 12. The voltage across primary windings 6 and 8 add relative to one another while the voltages across secondary windings 10 and 12 subtract from one another so as to cancel the voltage across windings 6 and 8. The DC control windings 26 and 28 are shown wound around and between each of the saturable cores 36 and 38. Also shown are the series connection of primary windings 6 and 8 with AC voltage source 4, the series connection of control windings 26 and 28 with current source 30, and the series connection of secondary windings 10 and 12 with the band pass filter 14 comprising capacitor 18 and inductor 20 and the parallel tank comprising capacitor 22 and winding 24.

Figure 3:
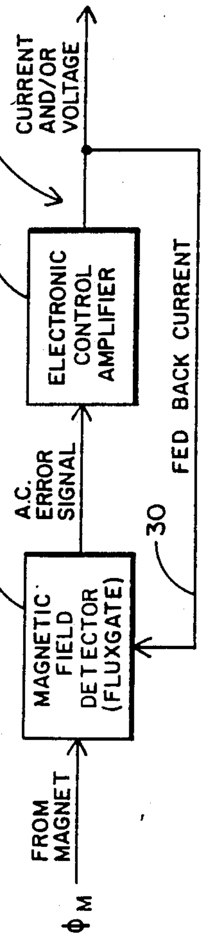
FIG. 3 is a block diagram illustrating a closed control loop for implementing the magnetic reference of the present invention.

Referring now to FIG. 3, a block diagram is shown which is representative of a closed electronic control system by which to implement the radiation hardened magnetic reference 60 which forms the present invention. Magnetic reference 60 includes the magnetic field detector 1 previously described when referring to FIGS. 1 and 2. As earlier indicated, magnetic field detector 1 senses the presence of a magnetic field generated by a stable, permanent magnet. As also previously described, the output from magnetic field detector 1 is an AC error signal (that is proportional to the magnetic field generated by the magnet less the field generated by a current that is fed back through the control windings 26 and 28 of detector 1 from an electronic control amplifier 40). As will soon be described, the electronic control amplifier 40 produces a fed back current which nulls out the magnetic field that is sensed by detector 1.

That is to say, the magnetic field, designated $\phi_M$, is cancelled by magnetic field detector 1 when an equal and opposite field is generated by the fedback current (source 30) supplied by electronic control amplifier 40. Cancellation of the magnetic field produces the AC error signal at the output terminals (designated 32 and 33 in FIG. 2) of magnetic field detector 1, which error signal is ideally zero when the magnetic and fedback current generated fields are in exact balance. In the event that said fields are otherwise out of balance, the resultant error signal produced by magnetic field detector 1 has a frequency which is twice the frequency of the source of AC reference voltage (designated 4 in FIG. 1). Therefore, the magetic field detector 1 is sometimes known by those skilled in the art as a fluxgate second harmonic detector.

Figure 4:
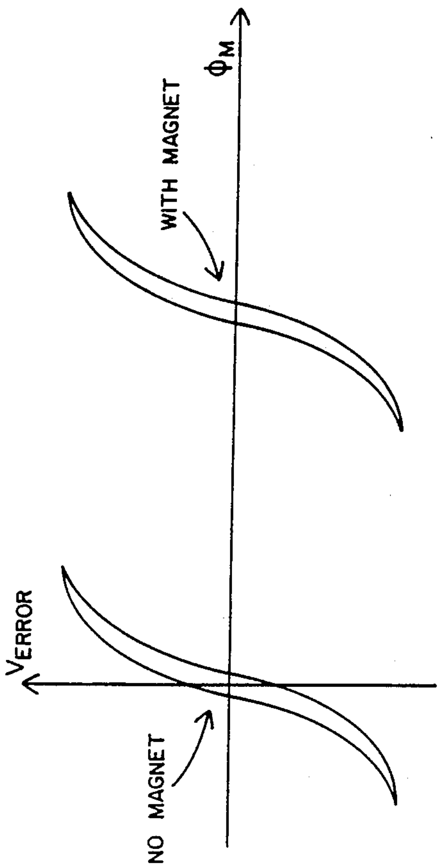
FIGS. 4 shows transfer functions of the magnetic field detector of FIG. 1 with and without a magnet to generate a magnetic field.

FIG. 4 of the drawings shows relatively narrow transfer curves for the magnetic field detector 1 which forms the radiation hardened reference of the present invention. The left hand curve represents the transfer function with no magnet (i.e. $\phi_M=0$) and the right-hand function represents a translated transfer curve when a stable, radiation hard permanent magnet is included as the basic reference for detector 1. The transfer functions indicate that the second harmonic error signal will reverse phase (i.e. a 180 degree phase shift) if either the magnetic flux or the fedback current should cause a change in the balance between the magnetic and fedback current generated fields.

Figure 5:
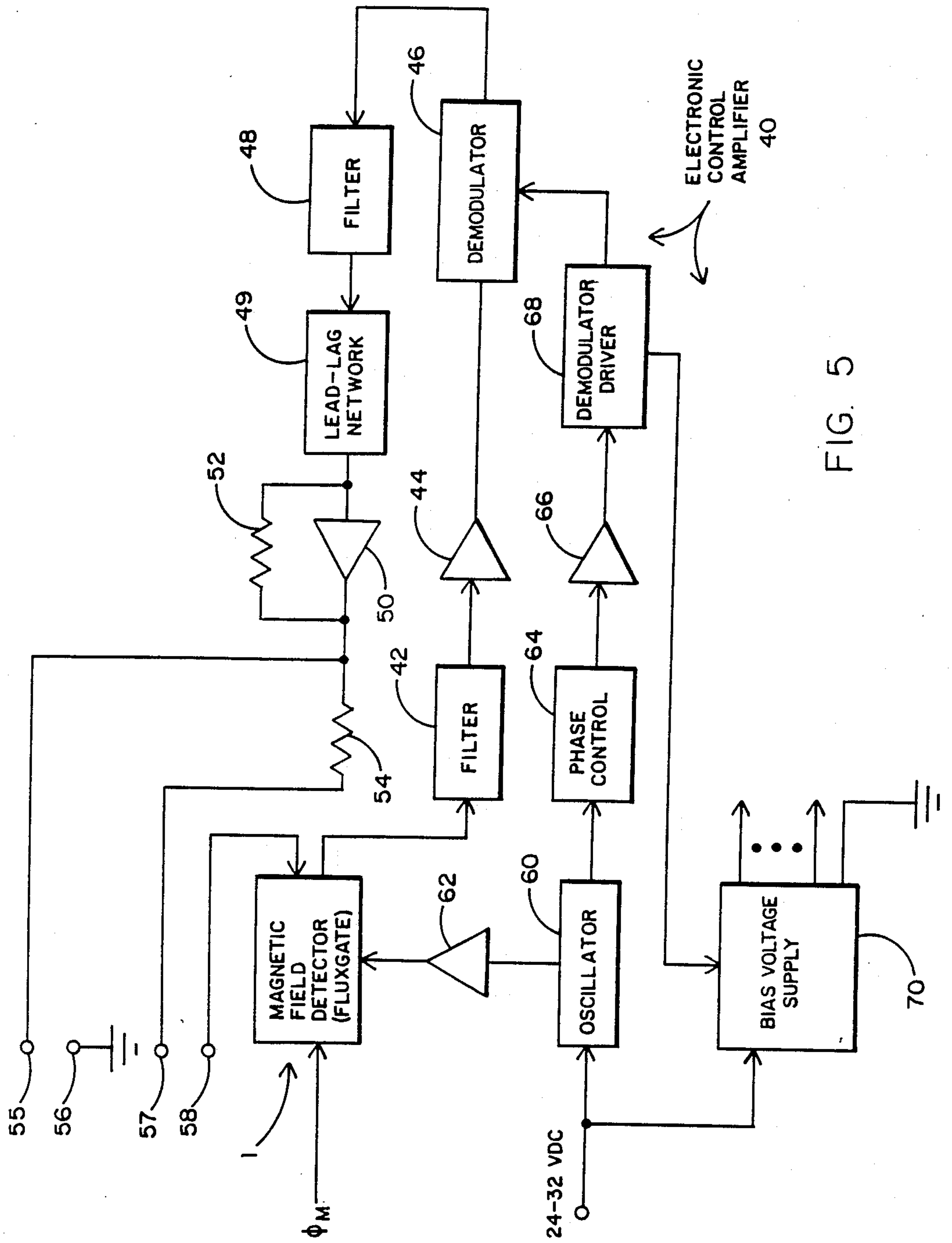
FIG. 5 is a block diagram of an electronic control amplifier which also forms the magnetic reference of the present invention.

FIG. 5 of the drawings is a block diagram that is representative of the electronic control amplifier 40 which closes the control loop for the radiation hardened magnetic reference 60 of FIG. 3. More particularly, the AC error signal at the output of magnetic field detector 1 is supplied to a filter 42. It may be desirable to enclose detector 1 and filter 42 in a temperature controlled magnetic shield. Filter 42 (e.g. an L-C band pass or twin-T filter) selects the second harmonic from the error signal and rejects all other frequencies. The error signal is then magnified by an AC amplifier 44. The output of amplifier 44 is applied to a phase discriminator (i.e. a full-wave demodulator) 46 which phase detects through the quadrature component of the second harmonic of the error signal to produce a DC signal. A low pass ripple filter 48 having a lead-lag network 49 for stability removes ripple from the DC signal of demodulator 46 to produce a clean DC signal. The DC signal is applied from filter 48 to a DC buffer amplifier 50 having a very low output impedance. A feedback resistor 52 is connected between the output and input terminals of amplifier 50 to ensure stability so that the fedback current can be provided, via a precision wire wound or film resistor 54 and a current sensor (not shown) connected between output terminals 57 and 58, to magnetic field detector 1 (at DC current source 30 of FIG. 1). The voltage drop across precision resistor 54 (i.e. at output terminals 55 and 56) is a stable, radiation impervious voltage. The current applied to detector 1 via precision resistor 54 (i.e. at output terminals 57 and 58) is a stable, radiation impervious current that corresponds to the current source 30 which is schematically illustrated in FIGS. 1 and 2. Such voltage and current are compatible with existing guidance and control electronic interfaces.

It may also be desirable that the electronic control amplifier 40 perform other functions. That is, amplifier 40 may include an oscillator 60 to generate a reference frequency for the AC voltage signal to be applied from source 4 (of FIG. 1) to magnetic field detector 1. This reference signal may be buffered through an AC buffer amplifier 62 prior to application to detector 1. Signals from reference frequency oscillator 60 may also be fed through a phase shifting network 64 (including a second harmonic synthesizer) and filtered at an AC buffer 66 to produce the (second harmonic) frequency for demodulator 46 by way of a drive circuit 68. What is more, electronic control amplifier 40 may also be used to provide a source 70 of bias voltages for application to the various electronic circuits which form the radiation hardened magnetic reference of the present invention.

Figure 6:
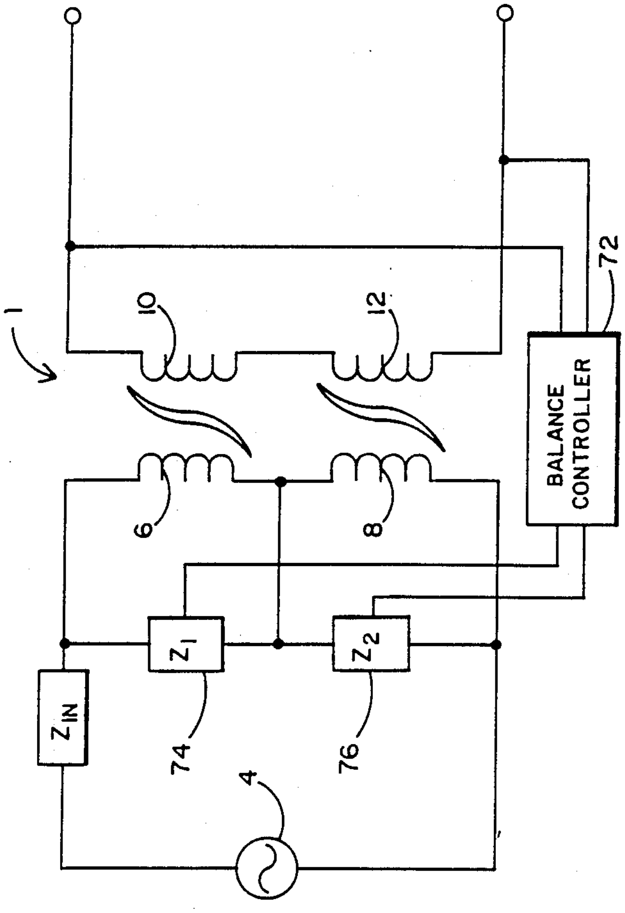
FIG. 6 is a circuit which automatically nulls to zero the first harmonic of an AC reference voltage that is supplied to the magnetic field detector of FIG. 1.

FIG. 6 of the drawings shows the use of a balance controller 72 to automatically balance to zero the first harmonic of the AC reference voltage supplied to magnetic field detector 1 from source 4. More particularly, the circuit for the magnetic field detector 1 is modified to include a pair of series connected variable impedances 74 and 76 connected across the primary windings 6 and 8 of detector 1. By way of example, impedances 74 and 76 may be variable reluctance coils or variable capacitors (i.e. varactors). In the event that the impedances of primary windings 6 and 8 are unbalanced, then variable impedances 74 and 76 can be adjusted to null out the first harmonic of the reference voltage from source 4. That is, the impedances of variable impedances 74 and 76 are adjusted so that the parallel impedance of the primary winding 6 (of magnetic core 36) ad the variable impedance 74 which is connected thereacross is equal to the parallel impedance of the primary winding 8 (of magnetic core 38) and the variable impedance 76 which is connected thereacross, whereby the voltages across the secondary windings 10 an 12 of detector 1 will subtract from and cancel one another. To this end, balance controller 72 preferably includes a first harmonic frequency select filter, an amplifier and a phase detector. The balance controller 72 senses the AC error signal of detector 1 and adjusts one (or both) of the variable impedances 74 or 76 until the first harmonic of said error signal is cancelled or nulled to zero, such that the signal across the secondary windings 10 and 12 of magnetic field detector 1 has only the second harmonic frequency of the original AC voltage signal.

It will be apparent that while a preferred embodiment of this invention has been shown and described, various modifications and changes may be made without departing from the true spirit and scope of the invention. For example, it is to be understood that the magnetic reference disclosed herein will also be accurate and stable without exposure to radiation and is, therefore, suitable as an alternative to semiconductor references and standard (electro-chemical) references.

Having thus set forth a preferred embodiment of the invention, what is claimed is:

1. A magnetic based reference to produce a stable voltage or current and comprising:

magnet means to generate a magnetic field;

magnetic field detector means to sense the magnetic field generated by said magnet means and provide an AC output signal that is indicative of the sensed magnetic field;

said magnetic field detector means including a saturable core transformer comprising at least two magnetic cores, each of said magnetic cores having a respective primary and secondary winding wound therearound and a common control winding wound therebetween, the primary windings of said cores being interconnected with one another and the secondary windings of said cores being interconnected with one another, and each of said primary windings being in phase with one another and each of said secondary windings being in phase opposition with one another;

means responsive to the output signal from said magnetic field detector means to provide a fed back current to the control winding which is wound between the cores of the saturable core transformer of said detector means by which to cancel the magnetic field sensed thereby;

load means to receive the fed back current provided to said control winding, such that the current through said load means and the voltage across said load means produce said stable current and voltage, respectively;

AC voltage source means for providing an AC input voltage signal to the primary windings of the cores of said saturable core transformer;

first variable impedance means connected across the primary winding of a first of the two magnetic cores of said saturable core transformer and second variable impedance means connected across the primary winding of the second magnetic core; and means responsive to the output signal generated by said detector means by which to adjust the impedance of said first and/or second variable impedance means such that the parallel impedance of said first variable impedance means and the primary winding of said first magnetic core is equal to the parallel impedance of said second variable impedance mans and the primary winding of said second magnetic core to thereby null the first harmonic of the AC input voltage signal, such that the AC output signal provided by said magnetic field detector means is the second harmonic of said AC input voltage signal.

2. The magnetic based reference recited in claim 1, wherein said magnetic field detector means is a flux gate.

3. The magnetic based reference recited in claim 1, wherein the secondary windings of the cores of said saturable core transformer are connected in electrical series with each other and with a band pass filter and a parallel tuned tank.

4. The magnetic based reference recited in claim 3, further comprising an impedance matching transformer having primary and secondary windings, the primary winding of said impedance matching transformer forming said parallel tuned tank and the secondary winding of said impedance matching transformer providing the AC output signal from said magnetic field detector means.

5. The magnetic based reference recited in claim 1, wherein the means to provide said fed back signal to said magnetic field detector means includes a filter that removes all frequencies other than the second harmonic frequency from the AC output signal of said magnetic field detector means.

6. The magnetic based reference recited in claim 5, wherein the means to provide said fed back signal also includes discriminator means interconnected with said filter to produce a DC signal from the AC signal provided by said filter.

7. The magnetic based reference recited in claim 6, wherein said load means to receive said fed back signal includes resistor means connected between said discriminator means and said magnetic field detector means.

* * * * *